United States Patent
Dixit et al.

(10) Patent No.: US 8,008,944 B2
(45) Date of Patent: Aug. 30, 2011

(54) LOW VOLTAGE DIFFERENTIAL SIGNALING DRIVER WITH PROGRAMMABLE ON-CHIP RESISTOR TERMINATION

(75) Inventors: Abhay S. Dixit, San Diego, CA (US); Vaishnav Srinivas, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 154 days.

(21) Appl. No.: 12/323,248

(22) Filed: Nov. 25, 2008

(65) Prior Publication Data
US 2010/0127736 A1 May 27, 2010

(51) Int. Cl.
*H03K 17/16* (2006.01)
(52) U.S. Cl. ......................................................... 326/30
(58) Field of Classification Search ..................... 326/30
See application file for complete search history.

(56) References Cited

U.S. PATENT DOCUMENTS

| | | | |
|---|---|---|---|
| 5,977,796 A | 11/1999 | Gabara | |
| 7,397,270 B1* | 7/2008 | Luo et al. | 326/32 |
| 2005/0083101 A1 | 4/2005 | Aoike | |
| 2005/0231282 A1 | 10/2005 | Nagano | |
| 2010/0073036 A1* | 3/2010 | Takeuchi et al. | 327/108 |

OTHER PUBLICATIONS

International Search Report, PCT/US2009/065314. International Searching Authority—European Patent Office. Jan. 27, 2010.
Written Opinion of the International Searching Authority, PCT/US2009/065314. International Searching Authority—European Patent Office. Jan. 27, 2010.
Bhowmik (Editor), Li (Editor), BOS (Editor), Mobile Displays: Technology and Applications (Wiley Series in Display Technology), 2008, Ch. 10, pp. 285-314.

\* cited by examiner

*Primary Examiner* — Shawki S Ismail
*Assistant Examiner* — Thienvu V Tran
(74) *Attorney, Agent, or Firm* — Nicholas J. Pauley

(57) ABSTRACT

A low voltage differential signaling driver is disclosed and may include a current steering output circuit having a first driver output and a second driver output. The low voltage differential signaling driver may also include a programmable on-chip resistor.

22 Claims, 8 Drawing Sheets

LOW VOLTAGE DIFFERENTIAL SIGNALING DRIVER WITH PROGRAMMABLE ON-CHIP RESISTOR TERMINATION

FIELD

The present invention generally relates to data drivers, and more particularly, to low voltage differential signaling drivers.

DESCRIPTION OF THE RELATED ART

A wireless device such as a mobile telephone may use parallel low speed complementary metal-oxide semiconductor (CMOS) lines for data communication off-chip, i.e., between a phone modem, e.g., a mobile station modem (MSM), and a liquid crystal display (LCD) or a camera. Multiple parallel low speed CMOS lines take up valuable space on a chip and for smaller form factor flip-phones it is very difficult to pass many, e.g., eighteen to twenty, parallel lines through a small knuckle. Serial high speed data lines may be used for off-chip data communication. Such data lines may substantially minimize the number of wires between a host, e.g., MSM, and a client, e.g., an LCD or a camera. However, as data rates increase for serial lines, it becomes increasingly difficult to use CMOS rail-to-rail drivers, which may not be able to operate at the higher data rates.

Low voltage differential signaling (LVDS) drivers may be used to transmit serial high speed data off-chip to receiving chips such as displays. An LVDS driver is a current mode cell that steers current to an external resistor at a receiving end with a desired voltage swing, e.g., 250 millivolts (mV). The variation in swing is typically limited to approximately twenty percent (20%) of the swing value. However, on-chip band gap current may have a variation in resistance to process variations during manufacture. This process variation may be plus-or-minus twenty percent (±20%) or greater. This process variation may cause the LVDS output driver swing to vary by plus-or-minus twenty percent (±20%) which may cause malfunction of the LVDS output driver.

Therefore, what is needed is an improved low voltage differential signaling driver.

SUMMARY OF THE DISCLOSURE

A low voltage differential signaling driver is disclosed and may include a current steering output circuit having a first driver output and a second driver output. The low voltage differential signaling driver may also include a programmable on-chip resistor. The programmable on-chip resistor may be selectively operable to act as a termination resistor and control an output swing of the driver. When the programmable on-chip resistor is enabled, a drive current is split between the programmable on-chip resistor and an off-chip termination resistor. In a particular aspect, the current steering output circuit may include first positive switch, a second positive switch connected to the first positive switch in parallel, a first negative switch connected in series with the second positive switch, and a second negative switch connected in series with the first positive switch and in parallel to the first negative switch.

Further, the current steering output circuit may be operable to switch between a first circuit configuration and a second circuit configuration. In the first circuit configuration, a drive current may flow through at least the first positive switch, the second driver output, an off-chip termination resistor, the first driver output, and the first negative switch. In the second circuit configuration, the drive current may flow through at least the second positive switch, the first driver output, the off-chip termination resistor, the second driver output, and the second negative switch.

In this aspect, the first positive switch and the second positive switch may be P-MOSFET switches and the first negative switch and the second negative switch may be N-MOSFET switches. Also, in this aspect, the low voltage differential signaling driver may also include a differential buffer connected to the first positive switch, the second positive switch, the first negative switch, and the second negative switch. The differential buffer may be operable to switch the current steering output circuit between the first circuit configuration and the second circuit configuration.

The low voltage differential signaling driver may also include a common mode feedback circuit connected to the first driver output and the second driver output. The common mode feedback circuit may be configured to sense a common mode output voltage and compare the common mode output voltage to a reference voltage. If the common mode output voltage is different from the reference voltage, the common mode feedback circuit may adjust the drive current of the low voltage differential signal driver to achieve a desired common mode output voltage.

In another aspect, a device is disclosed and may include a low voltage differential signaling driver. The low voltage differential signaling driver may include a current steering output circuit having a first driver output and a second driver output. The low voltage differential signaling driver may also include a programmable on-chip resistor. The programmable on-chip resistor may be selectively operable to act as a termination resistor and control an output swing of the driver. In this aspect, the current steering output circuit may include first positive switch, a second positive switch connected to the first positive switch in parallel, a first negative switch connected in series with the second positive switch, and a second negative switch connected in series with the first positive switch and in parallel to the first negative switch.

Further, the current steering output circuit may be operable to switch between a first circuit configuration and a second circuit configuration. In the first circuit configuration, a drive current may flow through at least the first positive switch, the second driver output, an off-chip termination resistor, the first driver output, and the first negative switch. In the second circuit configuration, the drive current may flow through at least the second positive switch, the first driver output, the off-chip termination resistor, the second driver output, and the second negative switch.

In this aspect, the first positive switch and the second positive switch may be P-MOSFET switches and the first negative switch and the second negative switch may be N-MOSFET switches. Also, in this aspect, the low voltage differential signaling driver may also include a differential buffer connected to the first positive switch, the second positive switch, the first negative switch, and the second negative switch. The differential buffer may be operable to switch the current steering output circuit between the first circuit configuration and the second circuit configuration.

The low voltage differential signaling driver may also include a common mode feedback circuit connected to the first driver output and the second driver output. The common mode feedback circuit may be configured to sense a common mode output voltage and compare the common mode output voltage to a reference voltage. If the common mode output voltage is different from the reference voltage, the common mode feedback circuit may adjust the drive current of the low voltage differential signal driver to achieve a desired common mode output voltage.

In yet another aspect, a device is disclosed and may include a low voltage differential signaling driver. The low voltage differential signaling driver may include a current steering output means having a first driver output and a second driver output and a programmable on-chip resistor means. The programmable on-chip resistor means may be selectively operable to act as a termination resistor and control an output swing of the driver.

The current steering output means may include a first positive switch means, a second positive switch means connected to the first positive switch means in parallel, a first negative switch means connected in series with the second positive switch, and a second negative switch means connected in series with the first positive switch means and in parallel to the first negative switch means.

In this aspect, the current steering output means may be operable to switch between a first configuration and a second configuration. In the first configuration, a drive current may flow through at least the first positive switch means, the second driver output, an off-chip termination resistor, the first driver output, and the first negative switch means. In the second configuration, the drive current may flow through at least the second positive switch means, the first driver output, the off-chip termination resistor, the second driver output, and the second negative switch means.

Further, in this aspect, the first positive switch means and the second positive switch means may include P-MOSFET switches and wherein the first negative switch means and the second negative switch means may include N-MOSFET switches. The device may also include a control means connected to the first positive switch means, the second positive switch means, the first negative switch means, and the second negative switch means. The control means may be operable to switch the current steering output means between the first configuration and the second configuration. Further, the device may include a common mode feedback means connected to the first driver output and the second driver output. The common mode feedback means may be configured to sense a common mode output voltage and compare the common mode output voltage to a reference voltage. If the common mode output voltage is different from the reference voltage, the common mode feedback means may adjust the drive current of the low voltage differential signal driver to achieve a desired common mode output voltage.

In yet another aspect, a method of converting a complementary metal oxide semiconductor input voltage signal to a differential low voltage signal for off-chip transmission is disclosed and may include receiving a complementary metal oxide semiconductor input voltage signal at a low voltage differential signaling driver, switching the low voltage differential signaling driver to a first circuit configuration or a second circuit configuration, and selectively controlling a programmable on-chip resistor on the low voltage differential signaling driver in order to control an output swing of the driver.

The method may also include converting the complementary metal oxide semiconductor input voltage signal to a differential output voltage and sensing a common mode output voltage. Further, the method may include comparing the common mode output voltage to a reference voltage and adjusting the drive current when the common mode output voltage is not equal to the reference voltage. In this aspect, a driver output swing may be adjusted using a common mode feedback amplifier.

In still another aspect, a device is disclosed and may include means for receiving a complementary metal oxide semiconductor input voltage signal at a low voltage differential signaling driver, means for converting the complementary metal-oxide semiconductor input voltage signal to a differential output voltage, means for switching the low voltage differential signaling driver to a first circuit configuration or a second circuit configuration, and means for selectively controlling a programmable on-chip resistor on the low voltage differential signaling driver in order to control an output swing of the driver.

Moreover, the device may include means for sensing a common mode output voltage. The device may also include means for comparing the common mode output voltage to a reference voltage and means for adjusting the drive current when the common mode output voltage is not equal to the reference voltage. Further, the device may include means for adjusting a driver output swing.

In another embodiment, a device is disclosed and may include logic for receiving a complementary metal oxide semiconductor input voltage signal at a low voltage differential signaling driver, logic for converting the complementary metal-oxide semiconductor input voltage signal to a differential output voltage, logic for switching the low voltage differential signaling driver to a first circuit configuration or a second circuit configuration, and logic for selectively controlling a programmable on-chip resistor on the low voltage differential signaling driver in order to control a driver output swing.

The device may also include logic for sensing a common mode output voltage. Further, the device may include logic for comparing the common mode output voltage to a reference voltage and logic for adjusting the drive current when the common mode output voltage is not equal to the reference voltage. Also, the device may include logic for controlling a driver output swing.

BRIEF DESCRIPTION OF THE DRAWINGS

In the figures, like reference numerals refer to like parts throughout the various views unless otherwise indicated.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, an "content" referred to herein, may also include files that are not executable in nature, such as documents that may need to be opened or other data files that need to be accessed.

In this description, the terms "communication device," "wireless device," "wireless telephone," "wireless communications device," and "wireless handset" are used interchangeably. With the advent of third generation (3G) wireless technology, more bandwidth availability has enabled more electronic devices with wireless capabilities. Therefore, a wireless device could be a cellular telephone, a pager, a PDA, a smartphone, a navigation device, or a computer with a wireless connection.

Figure 1:
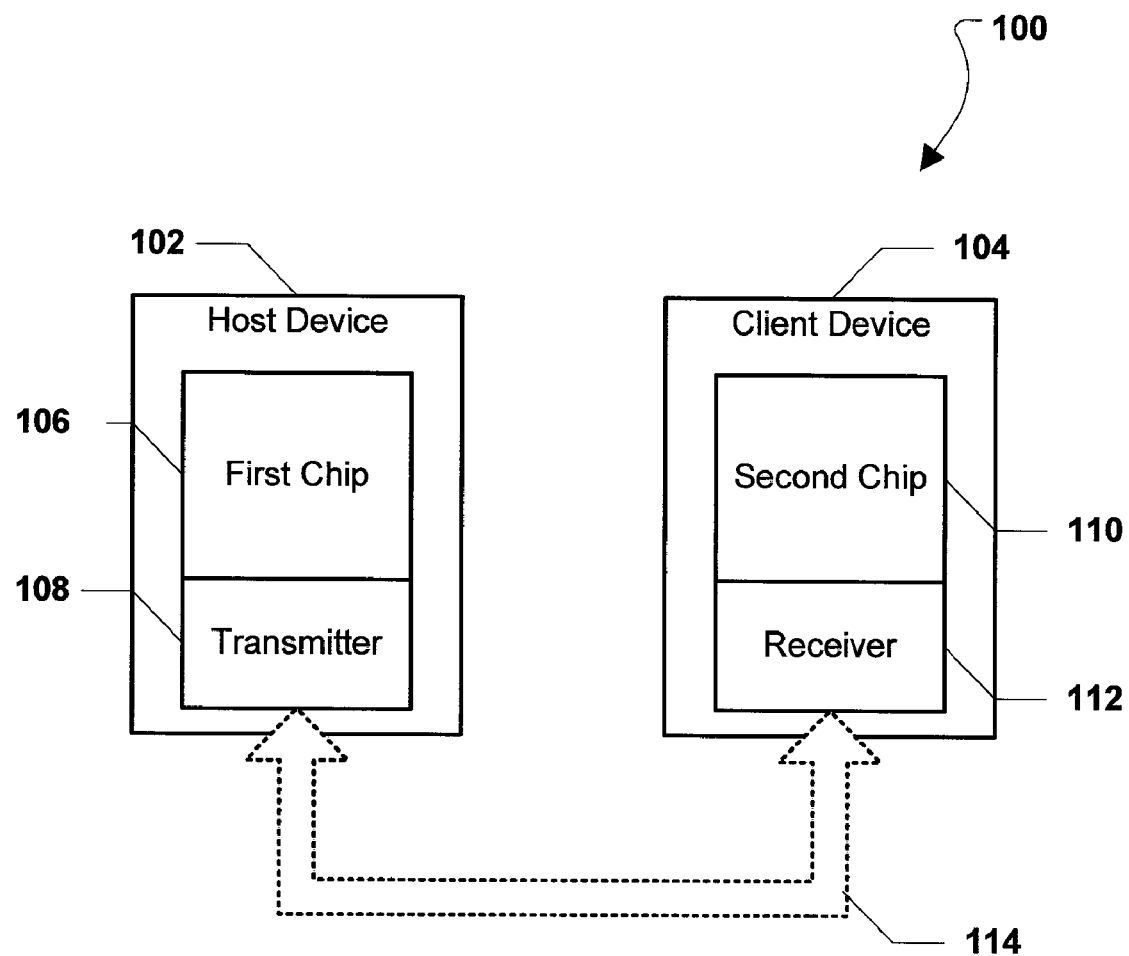
FIG. 1 is a diagram of a data system in accordance with an aspect.

FIG. 1 shows a data system, generally designated 100. As shown, the data system 100 may include a host device 102 and a client device 104. The host device 102 may be a circuit chip with a wireless device such as a mobile telephone. Further, the client device 104 may be a liquid crystal display (LCD) within a mobile telephone or other wireless device. Alternatively, the client device 104 may be a camera within a mobile telephone or other wireless device.

As illustrated in FIG. 1, the host device 102 may include a first chip 106 and the first chip 106 may include a transmitter chip 108. The transmitter chip 108 may be a low voltage differential signal (LVDS) driver, e.g., the LVDS driver described in conjunction with FIG. 3 through FIG. 7. The client device 104 may include a second chip 110 that may include a receiver chip 112 that is configured to receive data from the transmitter chip 108. The host device 102 may be connected to the client device 104 via a transmission line 114. In particular, the transmitter chip 108 may be connected to, or otherwise coupled to, the receiver chip 112 via the transmission line 114. The transmission line 114 may be a cable, a flex-wire, a trace on a PCB board, a combination thereof, or some other conductor known in the art.

Figure 2:
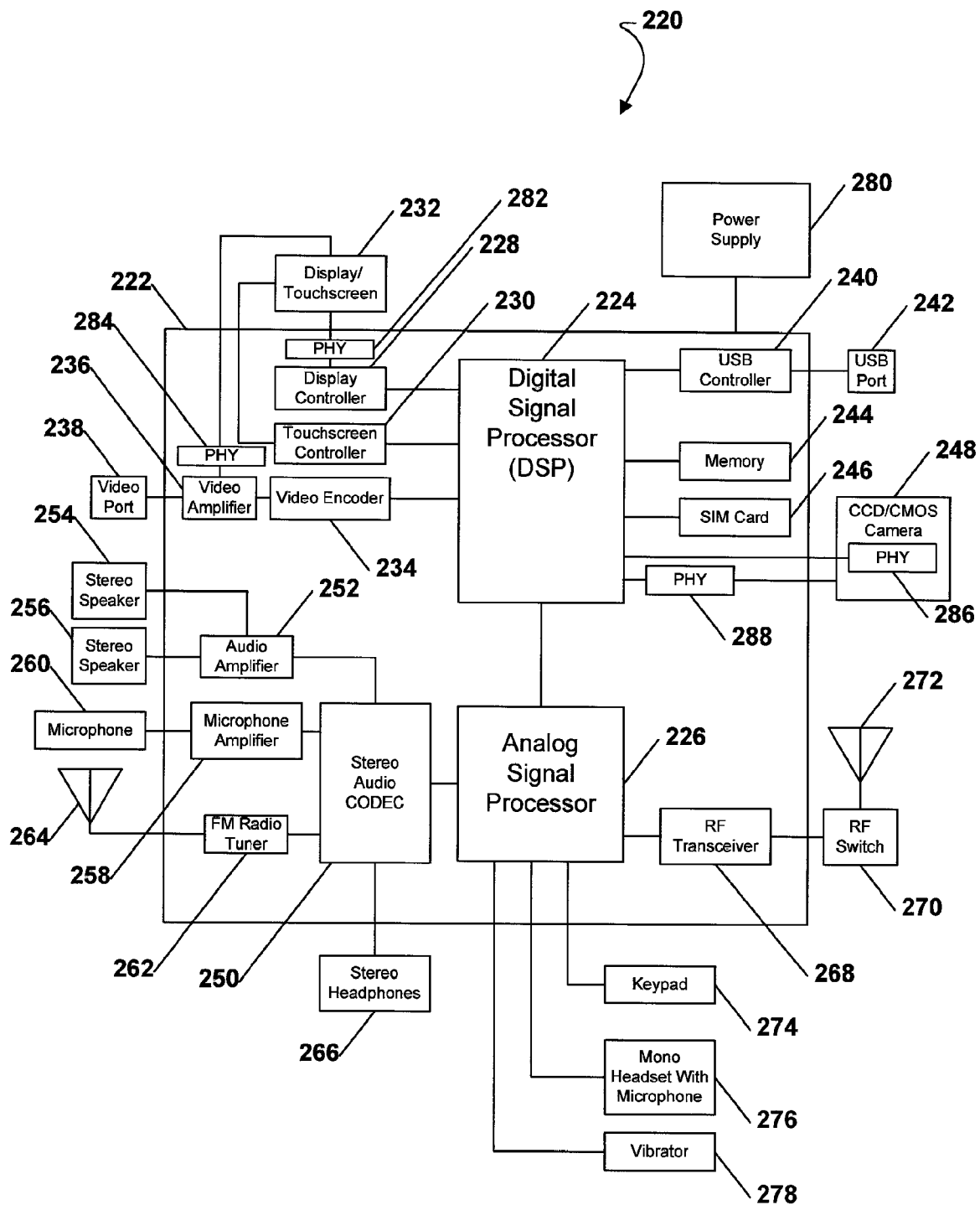
FIG. 2 is a diagram of a wireless device in accordance with an aspect.

Referring to FIG. 2, an exemplary, non-limiting aspect of a wireless device is shown and is generally designated 220. As shown, the wireless device 220 includes an on-chip system 222 that includes a digital signal processor 224 and an analog signal processor 226 that are coupled together. As illustrated in FIG. 2, a display controller 228 and a touchscreen controller 230 are coupled to the digital signal processor 224. In turn, a touchscreen display 232 external to the on-chip system 222 is coupled to the display controller 228 and the touchscreen controller 230.

FIG. 2 further indicates that a video encoder 234, e.g., a phase alternating line (PAL) encoder, a sequential couleur a memoire (SECAM) encoder, or a national television system(s) committee (NTSC) encoder, is coupled to the digital signal processor 224. Further, a video amplifier 236 is coupled to the video encoder 234 and the touchscreen display 232. Also, a video port 238 is coupled to the video amplifier 236. As depicted in FIG. 2, a universal serial bus (USB) controller 240 is coupled to the digital signal processor 224. Also, a USB port 242 is coupled to the USB controller 240. A memory 244 and a subscriber identity module (SIM) card 246 may also be coupled to the digital signal processor 224. Further, as shown in FIG. 2, a digital camera 248 may be coupled to the digital signal processor 224. In an exemplary aspect, the digital camera 248 is a charge-coupled device (CCD) camera or a complementary metal-oxide semiconductor (CMOS) camera.

As further illustrated in FIG. 2, a stereo audio CODEC 250 may be coupled to the analog signal processor 226. Moreover, an audio amplifier 252 may coupled to the stereo audio CODEC 250. In an exemplary aspect, a first stereo speaker 254 and a second stereo speaker 256 are coupled to the audio amplifier 252. FIG. 2 shows that a microphone amplifier 258 may be also coupled to the stereo audio CODEC 250. Additionally, a microphone 260 may be coupled to the microphone amplifier 258. In a particular aspect, a frequency modulation (FM) radio tuner 262 may be coupled to the stereo audio CODEC 250. Also, an FM antenna 264 is coupled to the FM radio tuner 262. Further, stereo headphones 266 may be coupled to the stereo audio CODEC 250.

FIG. 2 further indicates that a radio frequency (RF) transceiver 268 may be coupled to the analog signal processor 226. An RF switch 270 may be coupled to the RF transceiver 268 and an RF antenna 272. As shown in FIG. 2, a keypad 274 may be coupled to the analog signal processor 226. Also, a mono headset with a microphone 276 may be coupled to the analog signal processor 226. Further, a vibrator device 278 may be coupled to the analog signal processor 226. FIG. 2 also shows that a power supply 280 may be coupled to the on-chip system 222. In a particular aspect, the power supply 280 is a direct current (DC) power supply that provides power to the various components of the wireless device 220 that require power. Further, in a particular aspect, the power supply is a rechargeable DC battery or a DC power supply that is derived from an alternating current (AC) to DC transformer that is connected to an AC power source.

FIG. 2 further indicates that a first physical layer (PHY) 282 may be located between the display controller 230 and the display/touchscreen 232. In a particular aspect, the first PHY 282 may include a driver, e.g., the driver described below in conjunction with FIG. 3 through FIG. 7. A second PHY 284 may reside between the video amplifier 236 and the display/touchscreen 232. The second PHY 284 may include a driver, e.g., the driver described below in conjunction with FIG. 3 through FIG. 7. Also, as shown in FIG. 2, the CCD/CMOS camera 248 may include a third PHY 286. The third PHY 286 may include a driver, e.g., the driver described below in conjunction with FIG. 3 through FIG. 7. Also, a fourth PHY 288 may reside between the DSP 224 and the CCD/CMOS camera 248. The fourth PHY 288 may include a driver, e.g., the driver described below in conjunction with FIG. 3 through FIG. 7. In this aspect, the third PHY 286 may act as a forward-link driver from the CCD/CMOS camera 248 to the DSP 224 and the fourth PHY 288 may act as a reverse-link driver from the DSP 224 to the CCD/CMOS camera 248. Thus, two-way communication may be established between the DSP 224 and the CCD/CMOS camera 248.

As depicted in FIG. 2, the touchscreen display 232, the video port 238, the USB port 242, the camera 248, the first stereo speaker 254, the second stereo speaker 256, the microphone 260, the FM antenna 264, the stereo headphones 266, the RF switch 270, the RF antenna 272, the keypad 274, the mono headset 276, the vibrator 278, and the power supply 280 are external to the on-chip system 222.

In a particular aspect, one or more of the method steps described herein may be stored in the memory 244 as computer program instructions. These instructions may be executed by a processor 224, 226 in order to perform the methods described herein. Further, the processors, 224, 226, the memory 244, the instructions stored therein, or a combination thereof may serve as a means for performing one or more of the method steps described herein.

Figure 3:
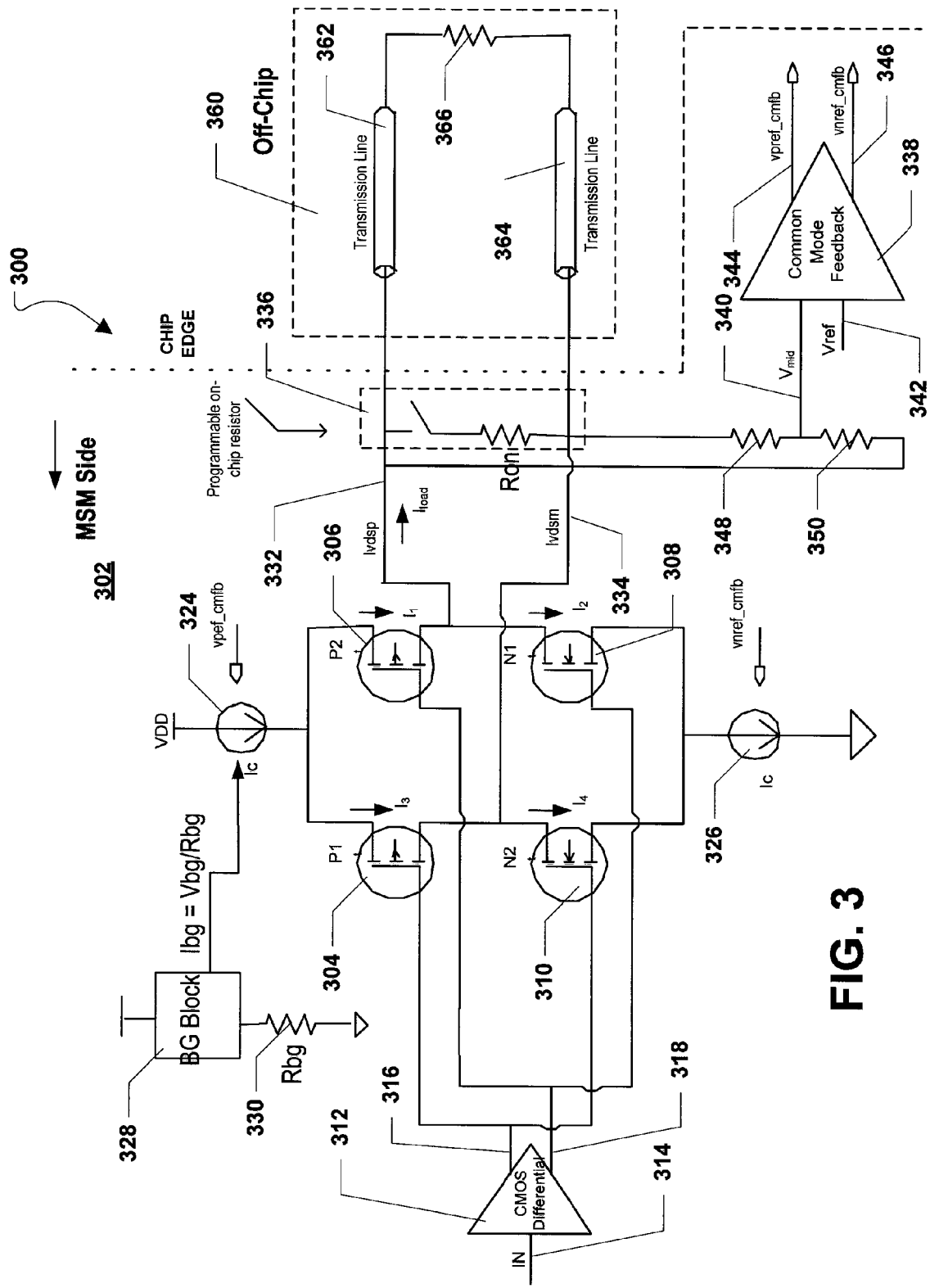
FIG. 3 is a first diagram of a low voltage differential signaling driver in accordance with an aspect.

Referring now to FIG. 3, a low voltage differential signaling (LVDS) driver is shown and is generally designated 300. As shown, the LVDS driver 300 may be located on a circuit chip 302, e.g., a silicon circuit chip. The LVDS driver 300 may include a first positive switch 304 and a second positive switch 306. The first positive switch 304 and the second positive switch may be P-MOSFET switches. As shown, a first negative switch 308 may be connected in series with the second positive switch 306. A second negative switch 310 may be connected in series with the first positive switch 304. The first positive switch 304 and second negative switch 310 are in parallel to the first negative switch 308 and the second positive switch 306. The negative switches 308, 310 may be N-MOSFET switches.

FIG. 3 further indicates that the LVDS driver 300 may include a differential buffer 312, i.e., e.g., a CMOS single-ended-to-differential buffer. The differential buffer 312 includes an input 314, a first output 316, and a second output 318. The first output 316 of the differential buffer 312 may be connected to the first positive switch 304 and the second negative switch 310. The second output 318 of the differential buffer 312 may be connected to the second positive switch 306 and the first negative switch 308.

As further depicted in FIG. 3, a first current source 324 may be connected to the first positive switch 304 and the second positive switch 306. A second current source 326 may be connected to the first negative switch 308 and the second negative switch 310. The first current source 324 may be a pFET current source and the second current source 326 may be an nFET current source. During operation, the switches 304, 306, 308, 310 may act as a current steering output switch, i.e., a current steering output means, and may be opened and closed to allow current to flow between the current sources 324, 326 along particular paths, described below. In order to not disturb the link common-mode voltage excessively, the turn-on time of the pFET and nFET current sources may be carefully matched. This ensures that the link common-mode voltage is not pulled excessively high or low during the turn on transient.

FIG. 3 also shows a band gap block 328 having a resistor 330. The band gap block 328 may provide a temperature independent band gap current, $I_{bg}$, to the driver 300. This current may vary with process and/or operating conditions as the band gap resistance, $R_{bg}$, varies with process and/or operating conditions. $R_{bg}$ may vary as much as plus or minus twenty percent (±20%) and accordingly, $I_{bg}$, may vary as much as plus or minus twenty percent (±20%). Further, in a particular aspect the first current source 324 may mirror the band gap current. The band gap current, $I_{bg}$, is equal to the band gap voltage, $V_{bg}$, divided by the band gap resistance, $R_{bg}$, shown as the band gap resistor 330.

As shown in FIG. 3, the driver 300 may include a first driver output 332 and a second driver output 334. A programmable on-chip resistor 336, i.e., a programmable on-chip resistor means, may be connected across the driver outputs 332, 334. In a particular aspect, the programmable on-chip resistor 336 may have the same resistance as the band gap block 328. Further, in a particular aspect, the decrease or increase in band gap current due to process variation and/or operating conditions in a resistor may be cancelled when the output voltage swing is taken across the same type of resistor, e.g., the programmable on-chip resistor 336. This configuration may yield relatively tight control of the output swing of the driver 300. Moreover, the programmable on-chip resistor 336 may also act as a source termination resistor and substantially improves the jitter performance of the driver 300 and extends the bandwidth of the driver. The programmable nature of the programmable on-chip resistor 336 allows the driver to select the value of the programmable on-chip resistor 336. Accordingly, using the programmable on-chip resistor 336 as an on-chip termination resistor the band width of the driver 300 is substantially increased and the precision of the output swing control is also substantially increased. When the driver 300 is turned off, the programmable on-chip resistor 336 may be disabled in order to provide a relatively high impedance for any other driver sitting on the transmission line.

The driver 300 may also include a common mode feedback (CMFB) amplifier 338 having a first input 340 and a second input 342. Further, the CMFB amplifier 338 may include a first output 344 and a second output 346. The first input 340 of the CMFB amplifier 338 may be connected to the first driver output 332 and the second driver output 334 through a first resistor 348 and a second resistor 350. The second input 342 of the CMFB amplifier 338 may be connected to a reference voltage. As shown, the first resistor 348 and the second resistor 350 may be installed in parallel between the first input 340 of the CMFB amplifier 338 and the driver outputs 332, 334. This configuration helps to sense the common mode of the outputs 332, 334. The first output 344 of the CMFB amplifier 338 may be connected to tune the first current source 324 in order to adjust $V_{mid}$ to $V_{ref}$. The second output 346 of the CMFB amplifier 338 may be connected to tune the second current source 326 in order to adjust $V_{mid}$ to $V_{ref}$. It is to be understood that $V_{mid}$ is the sensed common mode voltage of the driver outputs 332, 334.

In a particular aspect, the CMFB amplifier 338 may sense the common mode output voltage, i.e., at the outputs 332, 334 of the driver 300, and compare that voltage value to a reference voltage, e.g., half of the supply voltage. If those values are different, the CMFB amplifier 338 may adjust the drive current in order to adjust the common mode output voltage to a correct, or desired, value.

FIG. 3 further indicates that the driver 300 may be coupled to one or more off-chip board components 360. Specifically, the first driver output 332, may be coupled to, or otherwise connected to, a first off-chip transmission line 362. Also, the second driver output 334 may be coupled to, or otherwise connected to, a second off-chip transmission line 364. An off-chip termination resistor 366 may be installed between the off-chip transmission lines 362, 364.

During operation, the current sources 324, 326 may be used to inject a current into the circuit formed by the driver 300 and the off-chip board components 360. The differential buffer 312 may provide control signals to the switches 304, 306, 308, 310 which may cause the driver 300 to control the direction that the current travels through the circuit.

Figure 4:
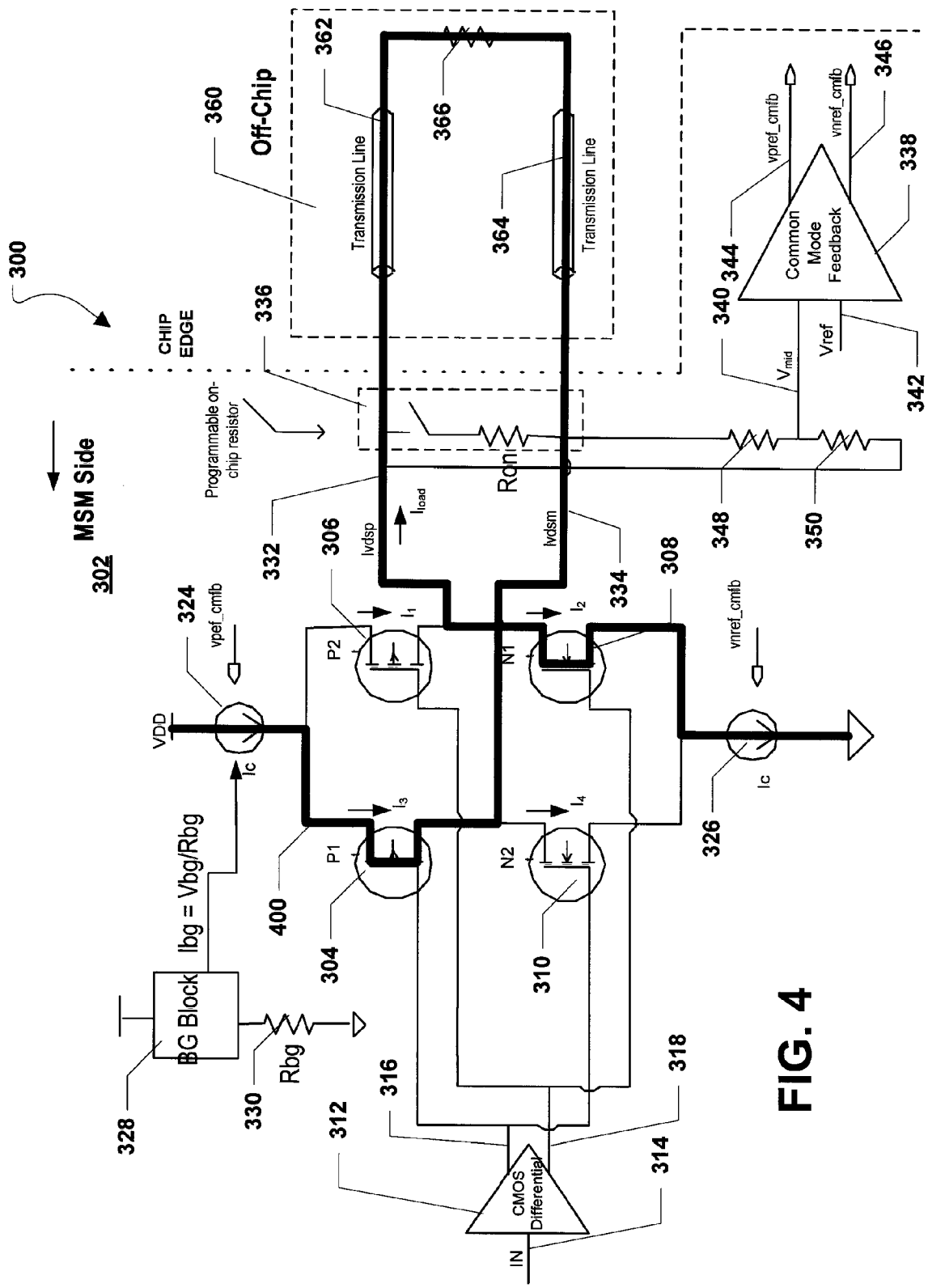
FIG. 4 is a second diagram of the low voltage differential signaling driver.

For example, the differential buffer 312 may close the first positive switch 304 and the first negative switch 308 and open the second positive switch 306 and the second negative switch 310 in order to establish a first circuit configuration, shown in FIG. 4. As indicated by path 400 in FIG. 4, in the first circuit configuration, the current may flow from the first current source 324, through the first positive switch 304, through the second driver output 334, through the second transmission line 364, and through the off-chip termination resistor 366. The current may then return through the first off-chip transmission line 362, through the first driver output 332, through the first negative switch 308, and terminate at the second current source 326.

Figure 5:
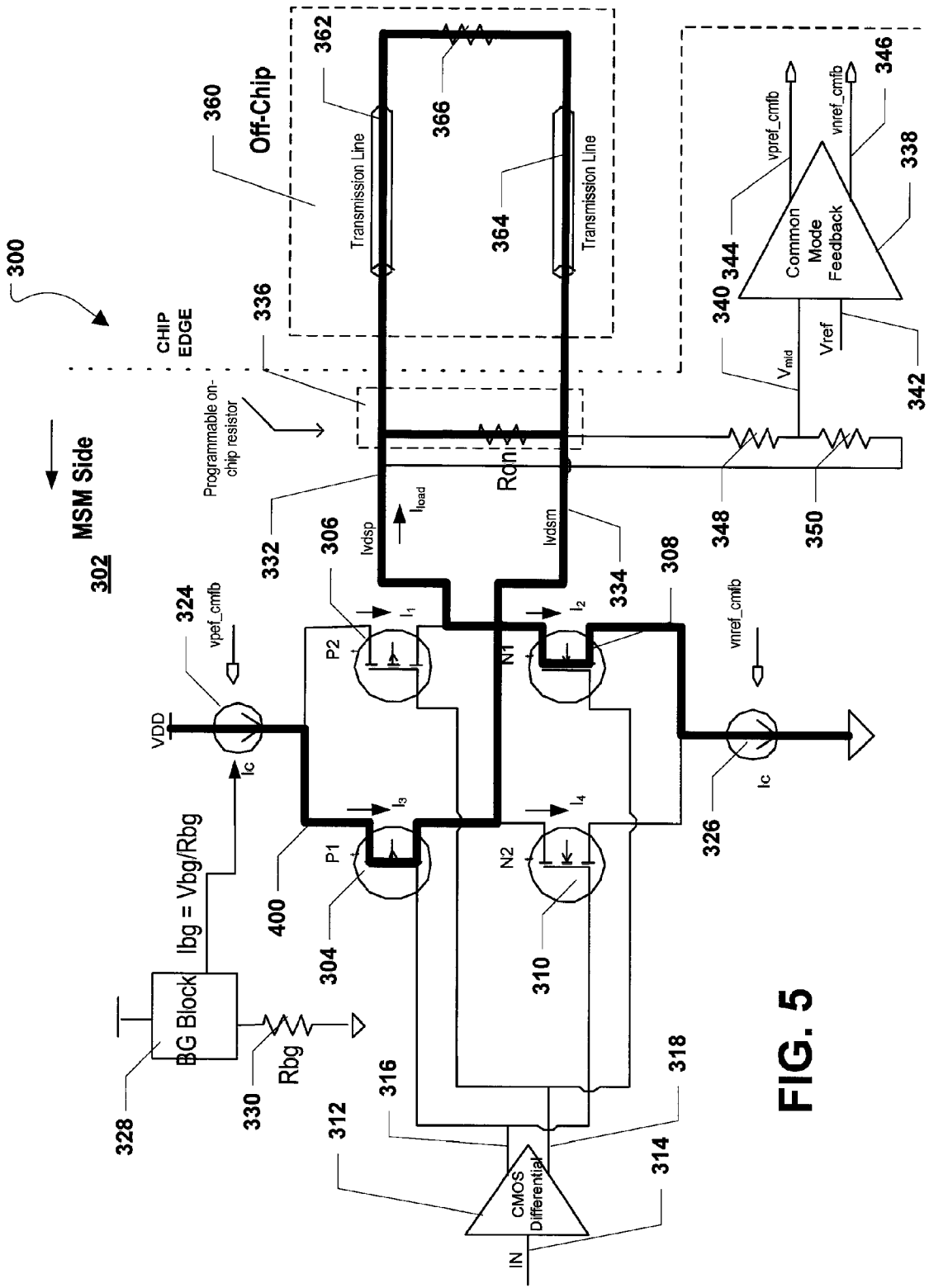
FIG. 5 is a third diagram of the low voltage differential signaling driver.

As shown in FIG. 5, when the programmable on-chip resistor is closed, the current may be split between the programmable on-chip resistor and the off-chip termination resistor. As such, the programmable on-chip resistor may act as an on-chip termination resistor.

Figure 6:
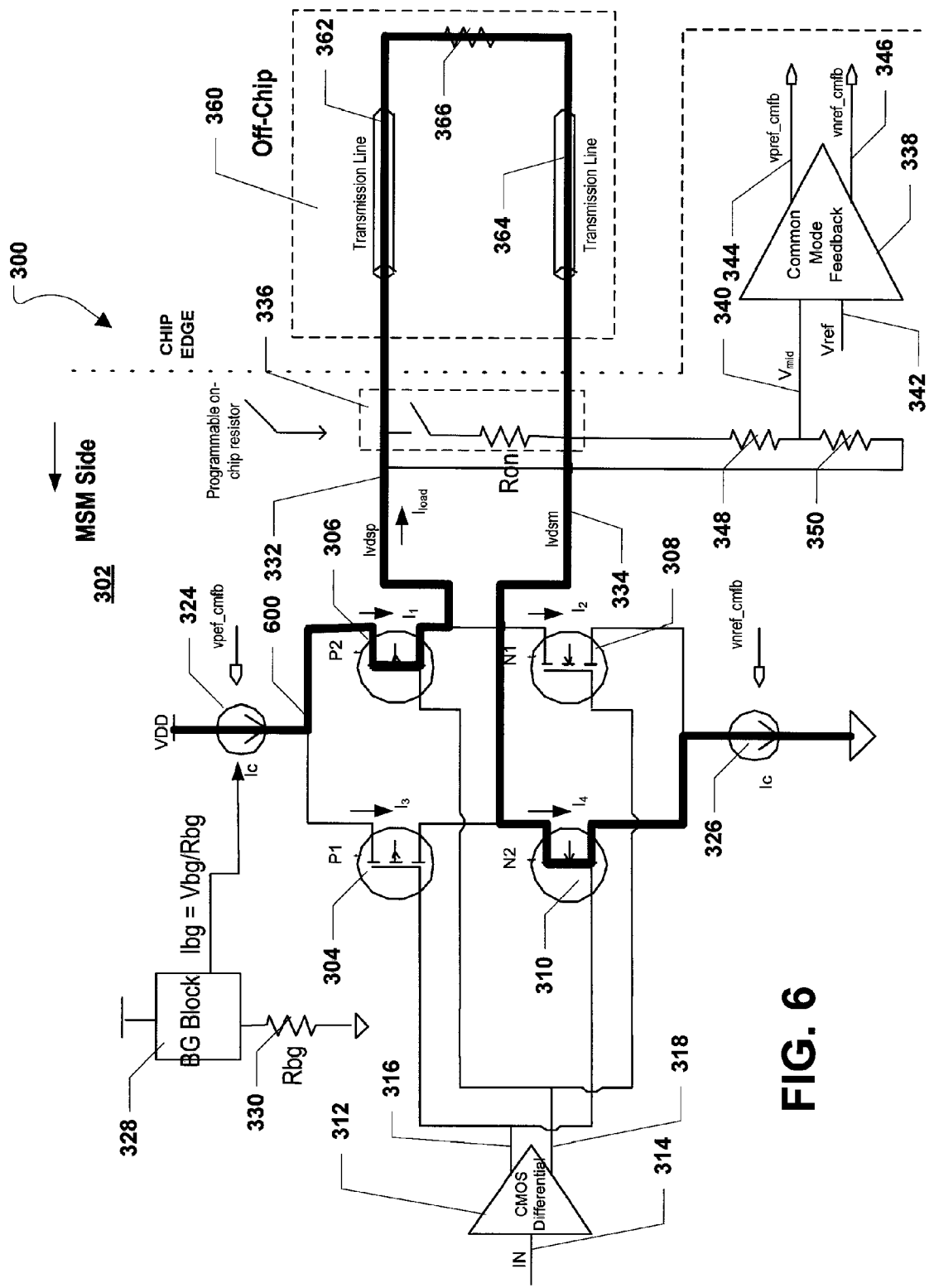
FIG. 6 is a fourth diagram of the low voltage differential signaling driver.

The differential buffer 312 may also close the second positive switch 306 and the second negative switch 310 and open the first positive switch 304 and the first negative switch 308 in order to establish a second circuit configuration, shown in FIG. 6. As indicated by path 600 in FIG. 6, in the second circuit configuration, the current may flow from the first current source 324, through the second positive switch 306, through the first driver output 332, through the first transmission line 362, and through the off-chip termination resistor 366. The current may then return through the second off-chip transmission line 364, through the second driver output 334, through the second negative switch 310, and terminate at the second current source 326.

Figure 7:
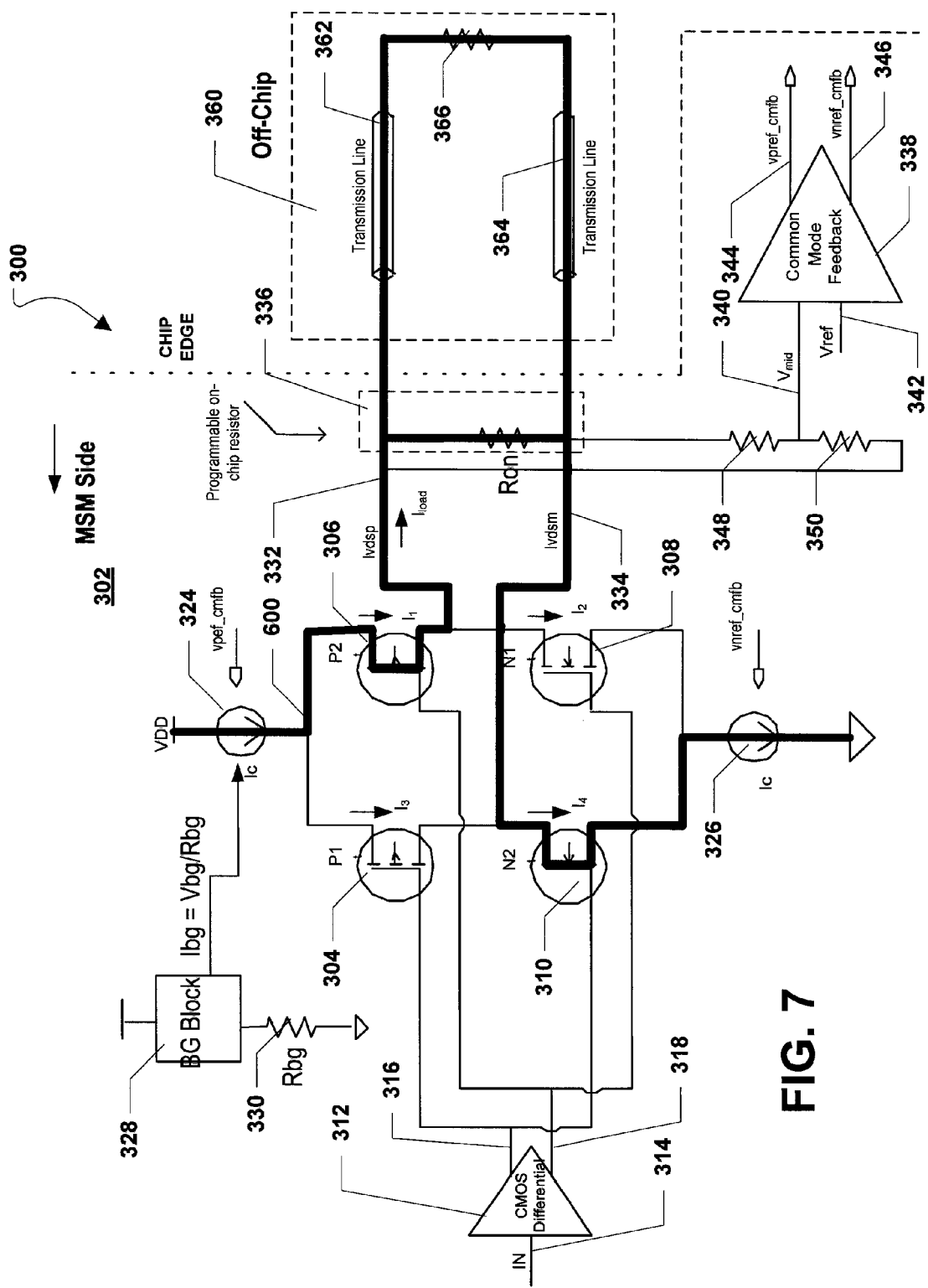
FIG. 7 is a fifth diagram of the low voltage differential signaling driver.

As shown in FIG. 7, when the programmable on-chip resistor is closed, the current may be split between the programmable on-chip resistor and the off-chip termination resistor. As such, the programmable on-chip resistor may act as an on-chip termination resistor.

The off-chip system 360 may sense the polarity of the voltage associated with the current to determine the logic level, e.g., a logic "1" or a logic "0". In the first circuit configuration, shown in FIG. 4, the off-chip system 360 may sense a logic "0" based on the polarity of the voltage associated with the current signal. In the second circuit configuration, shown in FIG. 6, the off-chip system 360 may sense a logic "1" based on the polarity of the voltage associated with the current signal.

Figure 8:
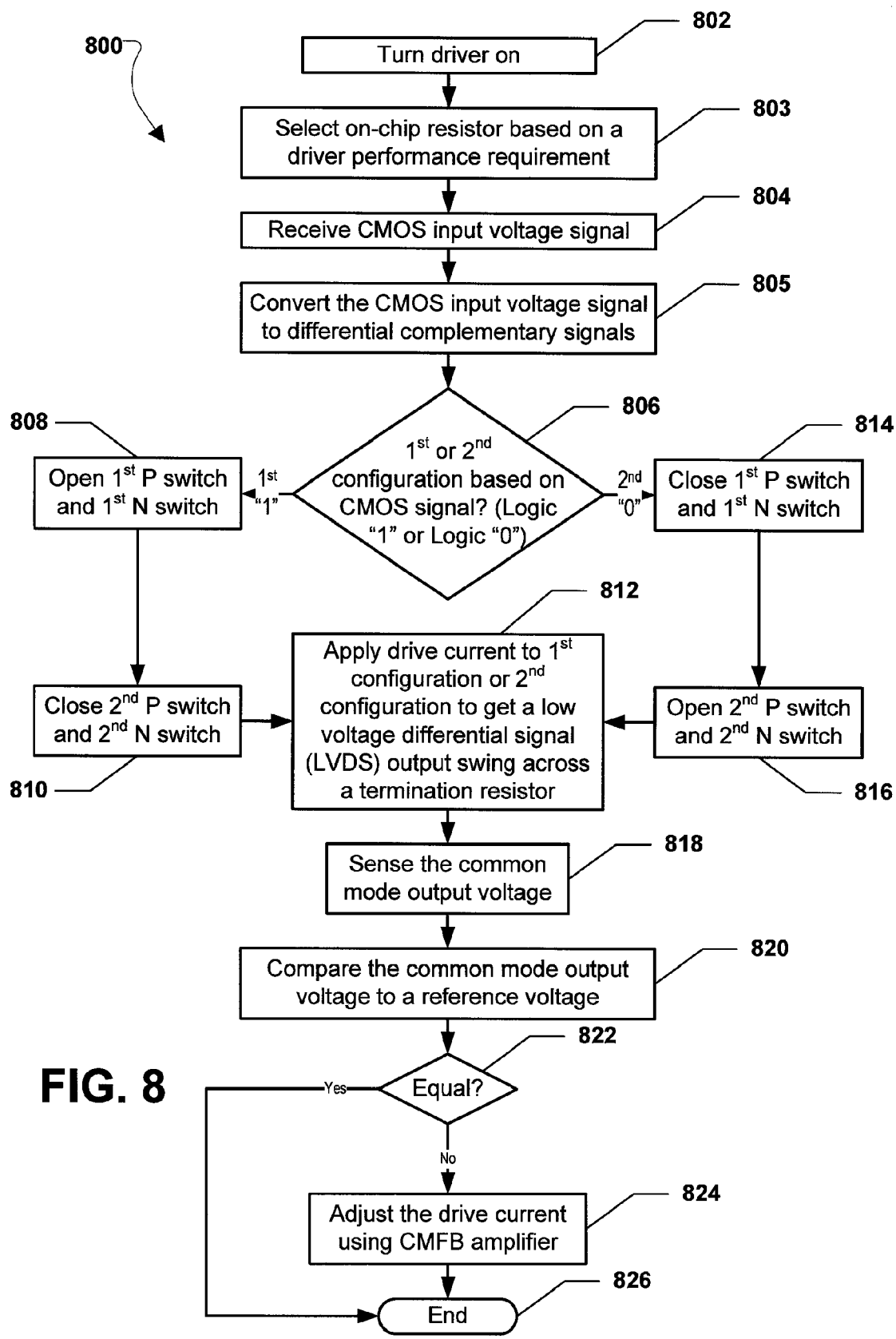
FIG. 8 is a flowchart illustrating a method of converting a CMOS input voltage signal to a differential low voltage signal for off-chip transmission in accordance with an aspect.

FIG. 8 illustrates a method, designated 800, of converting a CMOS input voltage signal to a differential low voltage signal for off-chip transmission. The method 800 commences at block 802 in which a low voltage differential signaling (LVDS) driver, e.g., the LVDS driver 300 described herein, is turned on, or otherwise energized. At block 803, a programmable on-chip resistor may be selected based on a driver performance requirement. At block 804, a CMOS input voltage signal may be received at the LVDS. At block 805, the CMOS input voltage signal may be converted to differential complementary signals.

Moving to decision step 806, it may be determined whether to switch the driver to a first circuit configuration or a second circuit configuration. This determination may be based on the CMOS signal, e.g., the differential output voltage signal generated therefrom. The CMOS signal may indicate a logic "1" or a logic "0". The logic "1" may correspond to the first circuit configuration and the logic "0" may correspond to the second circuit configuration.

If the first circuit configuration is selected, the method 800 may proceed to block 808 and a first positive switch and a first negative switch may be closed. Thereafter, at block 810, a second positive switch and a second negative switch may be opened. The method 800 may then proceed to block 812, described below.

Returning to decision step 806, if the second circuit configuration is selected, the method 800 may proceed to block 814 where the first positive switch is opened and the first negative switch is opened. Then, at block 816, the second positive switch may be closed and the second negative switch may be closed. Thereafter, the method 800 may continue to block 812. At block 812, a drive current may applied to the first circuit configuration or the second circuit configuration in order to get a low voltage differential signal (LVDS) output swing across a termination resistor.

Moving to block 818, the common mode output voltage may be sensed, e.g., by a common mode feedback circuit, i.e., a common mode feedback means. For example, the common mode feedback circuit may be the common mode feedback circuit, described above. At block 820, the common mode output voltage may be compared to a reference voltage. In a particular aspect, the reference voltage may be user selected. Further, in a particular aspect, the reference voltage may be equal to one-half (½) of the supply voltage. Continuing to decision step 822, it may be determined whether the common mode output voltage is equal to the reference voltage. If these values are not equal, the method 800 may continue to block 824 and the drive current may be adjusted by using the CMFB amplifier. Thereafter, the method 800 may end at state 826. Returning to decision step 822, if the common mode output voltage is equal to the reference voltage, the method 800 may proceed directly to state 826 and the method 800 may end.

It is to be understood that the method steps described herein do not necessarily have to be performed in the order as described. Further, words such as "thereafter", "then", "next", etc. are not intended to limit the order of the steps. These words are simply used to guide the reader through the description of the method steps.

With the configuration of structure described herein, the driver 300 provides a transmission speed from at least three hundred Megabits per second (300 Mbps) to greater than one Gigabits per second (1 Gbps). Further, the driver 300 as configured may provide substantially less jitter. The driver 300 also provides precise output rise control and fall time control. Moreover, the driver 300 provides an output swing control of less than twenty percent (20%) across PVT. Also, the driver 300 provides the same low jitter across a wide temperature range, e.g., from negative forty degrees Celsius (−40° C.) to one hundred twenty-five degrees Celsius (125° C.).

The driver 300 produces variable swings, by adjusting the driver output current. These swing control options are provided to ensure that the differential voltage amplitude may be adjusted for particular applications. In a particular aspect, the driver 300 may be used in mobile telephones, mobile Internet devices, portable personal computing devices, or any other devices that utilize wire-line interfaces or high speed serial lines.

It may be appreciated that all of the different SerDes (Serialzer-Deserializer) standards impose some swing limitations on driver output. The specifications may define a driver swing output and a minimum and maximum swing allowed. For example, the range of minimum and maximum swing may be plus-or-minus (+/−20%).

The driver disclosed herein may use some reference current from an on-chip reference generator, e.g., the band gap block. This reference generator, i.e., the band gap block, may provide temperature and voltage independent bias current. However, this current may vary with process variation. The variation in current may be caused or influenced by variation in the on-chip resistor which may be greater than plus-or-minus twenty-five percent (+/−25%).

In order to obtain the voltage swing at the output, i.e., at the receiver input at the client chip, the current is passed over an off-chip termination resistor. The off-chip resistor is relatively accurate, e.g., plus-or-minus one percent (+/−1%). Accordingly, the output swing may vary as per the variation in drive current. For example, if the drive current varies by plus-or-minus twenty-five percent (+/−25%), the output swing may also vary by plus-or-minus twenty-five percent (+/−25%) which may violate any output swing min/max limits.

To get around this issue, an external resistor may be used for generating ref current. As this external resistor is accurate, the reference current will also be controlled. However, this requires the use of external passive component and adds to the bill of material and eventually, to the product cost.

As disclosed herein, a programmable on-chip resistor may be used as a termination resistor across the driver output. This may provide cancelling of any variation in output swing when taken across the parallel combination of the termination resistor on-chip, i.e., the programmable on-chip resistor, and the off-chip termination resistor used at the client side. The on-chip termination resistor may also provide the termination at the source end and may substantially improve the driver bandwidth. As such, both DC and AC performance specifications of the driver are improved without using any extra off-chip components. Further, this on-chip termination resistor may be programmable in order to provide the option to disable the on-chip termination resistor when the driver is disabled. This may make the on-chip termination resistor non-transparent to the system when some other off-chip drivers sharing the same transmission line with this driver drive the line.

The following provides a brief explanation for how the on-chip driver termination helps minimize output swing variation.

Case 1: No-on chip driver termination used $$\text{Driver } V_{swing} = I_{bg} * k * R_{off\text{-}chip}$$

Where, k=driver amplification constant $$I_{bg} = V_{bg}/R_{on\text{-}chip} = \text{ref current}$$

$R_{off\text{-}chip}$=usually 100 Ohm, +/−1% accurate
$R_{on\text{-}chip}$ varies>+/−25%

Accordingly, as $R_{on\text{-}chip}$ increases by >+25%, $I_{bg}$ will decrease >−25%, since $I_{bg}$ is inversely proportional to $R_{on\text{-}chip}$. Further, as $I_{bg}$ decreases by 25%, $V_{swing}$ may be reduced by 25% as well.

Case 2: Use of driver on-chip termination resistor $$\text{Driver } V_{swing} = I_{bg} * k * (R_{on\text{-}chip,termination} \| R_{off\text{-}chip})$$

For example, as $R_{on\text{-}chip}$ increases by 25%, $I_{bg}$ will decrease by 25%, but now the swing is taken across parallel combination of $R_{on\text{-}chip, termination}$ and $R_{off\text{-}chip}$. $R_{on\text{-}chip,termination}$ has increased by 25%, so the effect of reduced $I_{bg}$ would be counteracted (e.g., cancelled) by the increased $R_{on\text{-}chip,termination}$.

Accordingly, a relatively precise swing may be obtained. The cancellation may not be one hundred percent (100%), as the parallel combination of fixed $R_{off\text{-}chip}$ and $R_{on\text{-}chip,termination}$ may make the net resistance vary by twenty percent (20%) instead of twenty-five percent (25%). However, the $V_{swing}$ may have a variation of less than plus-or-minus five percent (>+/−5%), which would be well within the $V_{swing}$ variation specifications.

By adding the $R_{on\text{-}chip,termination}$, the driver current may be divided between $R_{on\text{-}chip,termination}$ and $R_{off\text{-}chip}$. Thus, for the same driver current in case 1 and 2 above now the output swing in case 2 would be reduced by fifty percent (50%) if the $R_{on\text{-}chip,termination}$ is of same value as $R_{off\text{-}chip}$. In order to restore the DC swing to the same level as in case 1, the driver current may be increased, e.g., doubled for the case when $R_{on\text{-}chip,termination}$ is same as $R_{off\text{-}chip}$.

As disclosed herein, the $R_{on\text{-}chip}$ termination resistor may be programmable. When it is the same as the $R_{off\text{-}chip}$ resistor, which matches with transmission line characteristic impedance, peak AC performance may be obtained at the cost of increased power consumption. For battery operated consumer devices, low power implementation circuit designs are important. By programming the $R_{on\text{-}chip,termination}$, a system designer may fix the $R_{on\text{-}chip,termination}$ to obtain peak performance to power ratio. The programming may be accomplished through software register programming.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that may be accessed by a computer. By way of example, and not limitation, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although selected aspects have been illustrated and described in detail, it will be understood that various substitutions and alterations may be made therein without departing from the spirit and scope of the present invention, as defined by the following claims.

What is claimed is:

1. A low voltage differential signaling driver, comprising:
   a current steering output circuit having a first driver output and a second driver output;
   a programmable on-chip resistor, wherein the programmable on-chip resistor is selectively operable to act as a termination resistor and control an output swing of the driver by countering a variation in a drive current;
   an on-chip reference resistor, substantially similar to the programmable on-chip resistor, driven by a band gap or reference voltage operable to generate a reference bias current; and
   a common mode feedback circuit connected to the first driver output and the second driver output, wherein the common mode feedback circuit is operable to selectively control the drive current.

2. The low voltage differential signaling driver of claim 1, wherein the current steering output circuit comprises:
   a first positive switch;
   a second positive switch;
   a first negative switch connected in series with the second positive switch;
   a second negative switch connected in series with the first positive switch, wherein the first positive switch and second negative switch are in parallel to the first negative switch and the second positive switch;
   a first current source connected to the first positive switch and the second positive switch; and
   a second current source connected to the first negative switch and the second negative switch, wherein the first current source and the second current source are derived from the reference bias current and provide the drive current to the low voltage differential signaling driver.

3. The low voltage differential signaling driver of claim 2, wherein the current steering output circuit is operable to switch between a first circuit configuration, wherein the drive current flows through at least the first positive switch, the second driver output, an off-chip termination resistor, the first driver output, and the first negative switch, and a second circuit configuration, wherein the drive current flows through at least the second positive switch, the first driver output, the off-chip termination resistor, the second driver output, and the second negative switch.

4. The low voltage differential signaling driver of claim 2, wherein the first positive switch and the second positive switch comprise p-MOSFET switches and wherein the first negative switch and the second negative switch comprise n-MOSFET switches.

5. The low voltage differential signaling driver of claim 3, further comprising a differential buffer connected to the first positive switch, the second positive switch, the first negative switch, and the second negative switch, wherein the differential buffer is operable to switch the current steering output circuit between the first circuit configuration and the second circuit configuration.

6. The low voltage differential signal driver of claim 1, wherein the common mode feedback circuit is configured to sense a common mode output voltage and compare the common mode output voltage to a reference voltage and the common mode feedback circuit is configured to adjust the drive current of the low voltage differential signal driver at least partially based on the comparison.

7. A device, comprising:
a low voltage differential signaling driver, wherein the low voltage differential signaling driver comprises:
a current steering output circuit having a first driver output and a second driver output;
a programmable on-chip resistor, wherein the programmable on-chip resistor is selectively operable to act as a termination resistor and control an output swing of the driver by countering a variation in a drive current;
an on-chip reference resistor, substantially similar to the programmable on-chip resistor, driven by a band gap or reference voltage operable to generate reference bias current; and
a common mode feedback circuit connected to the first driver output and the second driver output, wherein the common mode feedback circuit is operable to selectively control the drive current.

8. The device of claim 7, wherein the current steering output circuit comprises:
a first positive switch;
a second positive switch;
a first negative switch connected in series with the second positive switch;
a second negative switch connected in series with the first positive switch wherein the first positive switch and second negative switch are in parallel to the first negative switch and the second positive switch;
a first current source connected to the first positive switch and the second positive switch; and
a second current source connected to the first negative switch and the second negative switch, wherein the first current source and the second current source are derived from reference the bias current and provide the drive current to the low voltage differential signaling driver.

9. The device of claim 8, wherein the current steering output circuit is operable to switch between a first circuit configuration, wherein the drive current flows through at least the first positive switch, the second driver output, an on-chip termination resistor, an off-chip termination resistor, the first driver output, and the first negative switch, and a second circuit configuration, wherein the drive current flows through at least the second positive switch, the first driver output, an on-chip termination resistor, the off-chip termination resistor, the second driver output, and the second negative switch.

10. The device of claim 8, wherein the first positive switch and the second positive switch comprise p-MOSFET switches and wherein the first negative switch and the second negative switch comprise n-MOSFET switches.

11. The device of claim 9, further comprising a differential buffer connected to the first positive switch, the second positive switch, the first negative switch, and the second negative switch, wherein the differential buffer is operable to switch the current steering output circuit between the first circuit configuration and the second circuit configuration.

12. The device of claim 7, wherein the common mode feedback circuit is configured to sense a common mode output voltage and compare the common mode output voltage to a reference voltage and the common mode feedback circuit is configured to adjust the drive current of the low voltage differential signal driver at least partially based on the comparison.

13. A device, comprising:
a low voltage differential signaling driver, wherein the low voltage differential signaling driver comprises:
a current steering output means having a first driver output and a second driver output;
a programmable on-chip resistor means, wherein the programmable on-chip resistor means is selectively operable to act as a termination resistor and control an output swing of the driver by countering a variation in a drive current;
an on-chip reference resistor, substantially similar to the programmable on-chip resistor, driven by a band gap or reference voltage operable to generate reference bias current; and
a common mode feedback means connected to the first driver output and the second driver output, wherein the common mode feedback means is operable to selectively control the drive current.

14. The device of claim 13, wherein the current steering output means comprises:
a first positive switch means;
a second positive switch means;
a first negative switch means connected in series with the second positive switch;
a second negative switch means connected in series with the first positive switch means, wherein the first positive switch means and second negative switch means are and in parallel to the first negative switch means and the second positive switch means;
a first current source means connected to the first positive switch means and the second positive switch means; and
a second current source means connected to the first negative switch means and the second negative switch means, wherein the first current source means and the second current source means are derived from the reference bias current and provide the drive current to the low voltage differential signaling driver.

15. The device of claim 14, wherein the current steering output means is operable to switch between a first configuration, wherein a drive current flows through at least the first positive switch means, the second driver output, an off-chip termination resistor, the first driver output, and the first negative switch means, and a second configuration, wherein the drive current flows through at least the second positive switch means, the first driver output, the off-chip termination resistor, the second driver output, and the second negative switch means.

16. The device of claim 14, wherein the first positive switch means and the second positive switch means comprise p-MOSFET switches and wherein the first negative switch means and the second negative switch means comprise n-MOSFET switches.

17. The device of claim 15, further comprising a control means connected to the first positive switch means, the second positive switch means, the first negative switch means, and the second negative switch means, wherein the control means is operable to switch the current steering output means between the first configuration and the second configuration.

18. The device of claim 13, wherein the common mode feedback means is configured to sense a common mode output voltage and compare the common mode output voltage to a reference voltage and the common mode feedback means is configured to adjust the drive current of the low voltage differential signal driver at least partially based on the comparison.

19. A method of converting a complementary metal oxide semiconductor input voltage signal to a differential low voltage signal for off-chip transmission, comprising:
 receiving a complementary metal oxide semiconductor input voltage signal at a low voltage differential signaling driver;
 converting the complementary metal-oxide semiconductor input voltage signal to a differential output voltage;
 switching the low voltage differential signaling driver to a first circuit configuration or a second circuit configuration;
 selectively controlling a programmable on-chip resistor on the low voltage differential signaling driver in order to control a driver output swing by countering a variation in a drive current and to provide an on-chip termination resistor;
 generating a reference bias current by an on-chip reference resistor, substantially similar to the programmable on-chip resistor, driven by a band gap or reference voltage; and
 sensing a common mode output voltage;
 comparing the common mode output voltage to the reference voltage; and
 adjusting the drive current when the common mode output voltage is not equal to the reference voltage.

20. The method of claim 19, wherein the drive current is adjusted using a common mode feedback circuit.

21. A device, comprising:
 means for receiving a complementary metal oxide semiconductor input voltage signal at a low voltage differential signaling driver;
 means for converting the complementary metal-oxide semiconductor input voltage signal to a differential output voltage;
 means for switching the low voltage differential signaling driver to a first circuit configuration or a second circuit configuration;
 means for selectively controlling a programmable on-chip resistor on the low voltage differential signaling driver in order to control a driver output swing by countering a variation in a drive current and to provide an on-chip termination resistor;
 means for generating a reference bias current by an on-chip reference resistor, substantially similar to the programmable on-chip resistor, driven by a band gap or reference voltage; and
 means for sensing a common mode output voltage;
 means for comparing the common mode output voltage to the reference voltage; and
 means for adjusting the drive current when the common mode output voltage is not equal to the reference voltage.

22. A device, the device comprising:
 logic for receiving a complementary metal oxide semiconductor input voltage signal at a low voltage differential signaling driver;
 logic for converting the complementary metal-oxide semiconductor input voltage signal to a differential output voltage,
 logic for switching the low voltage differential signaling driver to a first circuit configuration or a second circuit configuration;
 logic for selectively controlling a programmable on-chip resistor on the low voltage differential signaling driver in order to control a driver output swing by countering a variation in a drive current and selectively provide an on-chip termination resistor;
 logic for generating a reference bias current by an on-chip reference resistor, substantially similar to the programmable on-chip resistor, driven by a band gap or reference voltage; and
 logic for sensing a common mode output voltage;
 logic for comparing the common mode output voltage to the reference voltage; and
 logic for adjusting the drive current when the common mode output voltage is not equal to the reference voltage.

* * * * *